(12) United States Patent
Gupta et al.

(10) Patent No.: US 11,761,117 B2
(45) Date of Patent: *Sep. 19, 2023

(54) SIC SINGLE CRYSTAL SUBLIMATION GROWTH APPARATUS

(71) Applicant: II-VI Delaware, Inc, Wilmington, DE (US)

(72) Inventors: Avinash Gupta, Basking Ridge, NJ (US); Ilya Zwieback, Township Of Washington, NJ (US); Edward Semenas, Allentown, PA (US); Marcus Getkin, Flanders, NJ (US); Patrick Flynn, Morris Plains, NJ (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/447,742

(22) Filed: Sep. 15, 2021

(65) Prior Publication Data

US 2022/0002906 A1    Jan. 6, 2022

Related U.S. Application Data

(60) Continuation of application No. 16/368,977, filed on Mar. 29, 2019, now Pat. No. 11,149,359, which is a
(Continued)

(51) Int. Cl.
*C30B 29/36* (2006.01)
*C30B 23/00* (2006.01)
*C30B 23/06* (2006.01)

(52) U.S. Cl.
CPC ............ *C30B 29/36* (2013.01); *C30B 23/005* (2013.01); *C30B 23/06* (2013.01); *C30B 23/066* (2013.01)

(58) Field of Classification Search
CPC ..... C30B 23/005; C30B 23/06; C30B 23/066; C30B 29/36
See application file for complete search history.

(56) References Cited

U.S. PATENT DOCUMENTS

| 4,556,436 A | 12/1985 | Addamiano |
| 4,866,005 A | 9/1989 | Davis et al. |

(Continued)

FOREIGN PATENT DOCUMENTS

| JP | 08295595 A | * 11/1996 |
| JP | H08295595 A | 11/1996 |
| JP | 2007320794 A | 12/2007 |

*Primary Examiner* — Hua Qi
(74) *Attorney, Agent, or Firm* — Blank Rome LLP

(57) ABSTRACT

A physical vapor transport growth system includes a growth chamber charged with SiC source material and a SiC seed crystal in spaced relation and an envelope that is at least partially gas-permeable disposed in the growth chamber. The envelope separates the growth chamber into a source compartment that includes the SiC source material and a crystallization compartment that includes the SiC seed crystal. The envelope is formed of a material that is reactive to vapor generated during sublimation growth of a SiC single crystal on the SiC seed crystal in the crystallization compartment to produce C-bearing vapor that acts as an additional source of C during the growth of the SiC single crystal on the SiC seed crystal.

8 Claims, 10 Drawing Sheets

Related U.S. Application Data division of application No. 13/255,151, filed as application No. PCT/US2010/028636 on Mar. 25, 2010, now Pat. No. 10,294,584.

(60) Provisional application No. 61/163,668, filed on Mar. 26, 2009.

(56) References Cited

U.S. PATENT DOCUMENTS

| | | |
|---|---|---|
| RE34,861 E | 2/1995 | Davis et al. |
| 5,527,747 A | 6/1996 | Lackey, Jr. et al. |
| 5,611,955 A | 3/1997 | Barrett et al. |
| 5,667,587 A | 9/1997 | Glass et al. |
| 5,683,507 A | 11/1997 | Barrett et al. |
| 5,746,827 A | 5/1998 | Barrett et al. |
| 5,895,526 A | 4/1999 | Kitoh et al. |
| 5,944,890 A | 8/1999 | Kitou et al. |
| 5,964,944 A | 10/1999 | Sugiyama et al. |
| 5,985,024 A | 11/1999 | Balakrishna et al. |
| 6,013,130 A | 1/2000 | Dieter et al. |
| 6,045,613 A | 4/2000 | Hunter |
| 6,056,820 A | 5/2000 | Balakrishna et al. |
| 6,063,185 A | 5/2000 | Hunter |
| 6,110,279 A | 8/2000 | Kito et al. |
| 6,113,692 A | 9/2000 | Jaussaud et al. |
| 6,136,093 A | 10/2000 | Shiomi et al. |
| 6,139,631 A | 10/2000 | Kato |
| 6,193,797 B1 | 2/2001 | Shiomi et al. |
| 6,336,971 B1 | 1/2002 | Nagato et al. |
| 6,391,109 B2 | 5/2002 | Shiomi et al. |
| 6,406,539 B1 | 6/2002 | Shigeto et al. |
| 6,464,781 B2 | 10/2002 | Fujiwara |
| 6,514,338 B2 | 2/2003 | Shigeto et al. |
| 6,554,897 B2 | 4/2003 | Golan |
| 6,797,060 B2 | 9/2004 | Shigeto et al. |
| 6,962,624 B2 | 11/2005 | Jurgensen et al. |
| 7,045,009 B2 | 5/2006 | Kato et al. |
| 7,217,322 B2 | 5/2007 | Babcock et al. |
| 7,316,746 B2 | 1/2008 | D'Evelyn et al. |
| 7,387,680 B2 | 6/2008 | Tsvetkov et al. |
| 7,396,411 B2 | 7/2008 | Kato et al. |
| 7,767,022 B1 | 8/2010 | Gupta et al. |
| 2001/0004877 A1 | 6/2001 | Shigeto et al. |
| 2003/0116084 A1 | 6/2003 | Shigeto et al. |
| 2005/0257734 A1 | 11/2005 | Madar et al. |
| 2006/0243984 A1 | 11/2006 | Gupta et al. |
| 2006/0254505 A1 | 11/2006 | Tsvetkov et al. |
| 2008/0001165 A1 | 1/2008 | Hashimoto et al. |
| 2008/0190355 A1 | 8/2008 | Chen et al. |
| 2009/0053125 A1 | 2/2009 | Gupta et al. |

\* cited by examiner

SiC SINGLE CRYSTAL SUBLIMATION GROWTH APPARATUS

CROSS-REFERENCE TO RELATED APPLICATION

This application is a continuation of Ser. No. 16/368,977, filed Mar. 29, 2019, which is a divisional application of U.S. patent application Ser. No. 13/255,151, filed on Jan. 19, 2012, which is the United States national phase of International Application No. PCT/US2010/028636 filed Mar. 25, 2010, and claims the benefit of U.S. Provisional Patent Application No. 61/163,668, filed Mar. 26, 2009, each of which is incorporated herein by reference in its entirety.

BACKGROUND OF THE INVENTION

Field of the Invention

The present invention relates to SiC sublimation crystal growth.

Description of Related Art

Wafers of silicon carbide of the 4H and 6H polytype serve as lattice-matched substrates to grow epitaxial layers of SiC and GaN, which are used for fabrication of SiC- and GaN-based semiconductor devices for power and RF applications.

With reference to FIG. 1, large SiC single crystals are commonly grown by the technique of Physical Vapor Transport (PVT). FIG. 1 shows a schematic view of a typical PVT growth cell, wherein PVT growth of a SiC single crystal 15 is carried out in a graphite crucible 11 sealed with a graphite lid 12 and loaded with a sublimation source 13 disposed at a bottom of crucible 11 and a single crystal SiC seed 14 disposed at the crucible top. Sublimation source 13 is desirably polycrystalline SiC grain synthesized in a separate process. Loaded crucible 11 is placed inside of a growth chamber 17 where it is surrounded by thermal insulation 18. Inductive or resistive heating is used to bring crucible 11 to a suitable temperature, generally, between 2000° C. and 2400° C., for the PVT growth of a SiC single crystal 15 on SiC single crystal seed 14.

FIG. 1 shows a typical inductive heating arrangement with a RF coil 19 placed outside growth chamber 17, which is desirably made of fused silica. RF coil 19 is positioned with respect to crucible 11 such that during growth of single crystal 15, a temperature of sublimation source 13 is maintained higher than a temperature of the seed crystal 14, typically, by 10° C. to 200° C.

Upon reaching suitable high temperatures, sublimation source 13 vaporizes and fills crucible 11 with vapor 16 of Si, $Si_2C$ and $SiC_2$ molecules. The temperature difference between sublimation source 13 and seed crystal 14 forces vapor 16 to migrate and condense on seed crystal 14 thereby forming single crystal 15. In order to control the growth rate, PVT growth is carried out in the presence of a small pressure of inert gas, typically, between several and 100 Torr.

Generally, SiC crystals grown using this basic PVT arrangement suffer from numerous defects, stress, and cracking. To this end, it is difficult to grow long boules of SiC single crystal 15 using conventional PVT due to carbonization of sublimation source 13 and subsequent massive incorporation of carbon inclusions in single crystal 15. Cracking becomes a major yield loss when the conventional PVT technique is utilized to grow large-diameter SiC single crystals.

Inclusions in PVT-grown crystals, e.g., single crystal 15, include carbon inclusions (particles), silicon droplets, and foreign polytypes. Carbon particles in single crystal 15 can be traced to SiC sublimation source 13 and the graphite forming crucible 11. Specifically, silicon carbide sublimes incongruently producing a silicon-rich vapor and carbon residue in the form of very fine carbon particles. During growth of single crystal 15, these fine particles become airborne and, transferred by the flow of vapor 16, incorporate into growing single crystal 15. Massive carbon incorporation into single crystal 15 happens at the end of the growth of single crystal 15 when a large amount of carbon residue is present in crucible 11.

Vapor erosion of the graphite forming crucible 11 can also produce carbon inclusions. During growth, the inner walls of crucible 11 are in contact with Si-rich vapor 16 which attack the graphite forming crucible 11 and erode it. Structurally, the graphite forming crucible 11 includes graphitic grains embedded into the matrix of graphitized pitch. The graphitized pitch is attacked by vapor 16 first. This leads to liberation of graphite grains which are transferred to the growth interface of single crystal 15.

Silicon inclusions (droplets) usually form at the beginning of the growth of single crystal 15, when the SiC sublimation source 13 source is fresh. Vapor 16 over SiC sublimation source 13 can contain a too high fraction of silicon, which can cause the formation of Si liquid on the growth interface of single crystal 15 and incorporation of Si droplets into single crystal 15.

A large number of polytypic modifications of silicon carbide exist, and inclusion of foreign polytypes in sublimation-grown 4H and 6H single crystal 15 is common (15R inclusions are most frequent). The origin of polytypic inclusions is often tied to the appearance of macrosteps on the growth interface of single crystal 15. The facets formed on the macrosteps are not stable against stacking faults. These stacking faults latter evolve during growth of single crystal 15 into foreign polytypes in single crystal 15.

Two technological factors affect the stability of the 6H and 4H polytypes during growth of single crystal 15. One is the curvature of the growth interface of single crystal 15. A flat or slightly convex growth interface of single crystal 15 is believed to be more stable against polytypic perturbations than a more curved interface, convex or concave. Another factor is the stoichiometry of vapor 16. It is believed that stable growth of the SiC crystals 15 of hexagonal 4H and 6H polytypes requires a vapor phase enriched with carbon, while a too high atomic fraction of Si in the vapor can lead to the appearance of foreign polytypes.

Three types of dislocations can generally exist in SiC single crystal 15 grown by PVT: threading screw dislocations, threading edge dislocations, and basal plane dislocations. The lines of the threading dislocations tend to position along the crystallographic c-direction, which is often used as a growth direction of SiC single crystals 15. Basal plane dislocations are dislocations with their lines parallel to the basal c-plane.

A micropipe is a threading screw dislocation with a large Burgers vector. When the Burgers vector exceeds (2–3)·c, the crystal relieves the stress caused by the dislocation by forming a hollow core, from a fraction of a micron to 100 microns in diameter.

Upon nucleation, growing SiC single crystal 15 inherits some of the dislocations from seed crystal 14. During growth of SiC single crystal 15, micropipes and dislocations participate in reactions with other micropipes and dislocations. This leads to a progressive reduction in the micropipe/dislocation densities during growth. In the case of growth disturbance, such as incorporation of a carbon particle or foreign polytype, new micropipes and dislocations are generated.

It has been observed that the magnitude of growth-related stress increases with the increase in the length and diameter of a SiC single crystal boule formed by the growth of SiC single crystal 15. More specifically, SiC single crystal 15 grown by conventional PVT exhibits nonuniform thermoelastic stress and its shear component often exceeds the critical value of 1.0 MPa leading to plastic deformation. Plastic deformation occurs via generation, multiplication and movement of dislocations. Unresolved stress accumulated during growth of a boule of SiC single crystal 15 can lead to cracking of the boule formed by the growth of SiC single crystal 15 during cooling of said boule to room temperature or during subsequent wafer fabrication.

With reference to FIG. 2, since the inception of the PVT growth technique, a number of process modifications have been developed. In one such modification, a cylindrical, gas-permeable divider 25, made of either thin-walled dense graphite or porous graphite, is utilized to divide a crucible 20 into two concentric compartments: a source storage compartment 24 containing a solid SiC sublimation source material 21 and a crystal growth compartment 26 with a SiC single crystal seed 22 at the bottom. For the purpose of simplicity, an RF coil and a growth chamber have been omitted from FIG. 2.

At high temperatures, SiC sublimation source 21 vaporizes and vapor 27 fills compartment 24. The volatile Si- and C-bearing molecules in vapor 27 diffuse across divider 25 and enter crystal growth compartment 26, as shown by the arrows in FIG. 2. Then, driven by the axial temperature gradient, vapor 27 migrate downward to SiC single crystal seed 22 and condense on it causing growth of a SiC single crystal 23.

The PVT process shown and described in connection with FIG. 2 has drawbacks, including, without limitation, the nucleation of polycrystalline SiC on the graphite walls of crucible 20 and/or divider 25, the nucleation of polycrystalline SiC on the edges of SiC single crystal seed 22, and a high degree of stress in the grown SiC single crystal 23. This PVT modification is considered inapplicable to the growth of industrial size SiC boules.

With reference to FIG. 3, in another modification of the basic PVT growth technique, PVT is used in combination with High Temperature Chemical Vapor Deposition (HTCVD) to achieve continuous growth of SiC single crystals of unlimited thickness. In the schematic diagram of a Continuous Feed PVT process (CF-PVT) shown in FIG. 3, a crystal growth crucible 30 is divided into two chambers: a lower chamber 33 for the HTCVD process, and an upper chamber 34, which includes a SiC single crystal seed 36, for PVT. Chambers 33 and 34 were separated by one or more members 35 made of gas-permeable graphite foam. Solid SiC source material 39 is placed atop the upper surface of foam member 35 that faces SiC single crystal seed 36. Heating of SiC source material 39 is provided by an RF coil 31 coupled to a graphite susceptor 32 in a manner known in the art.

Gaseous trimethylsilane (TMS) 37 is supplied to lower chamber 33 assisted by a peripheral flow of argon 38. At high temperatures, the TMS molecules undergo various chemical transformations. The gaseous products of these transformations diffuse through foam member 35 and form solid SiC, either in the bulk of foam member 35 or on the upper surface of foam member 35. In upper chamber 34, a conventional PVT growth process takes place. Namely, solid SiC source material 39 sublimates, its vapor migrates to SiC single crystal seed 36 and condenses thereon causing growth of SiC single crystal 36'.

It was believed that gas-feeding through foam member 35 would prolong the life of the SiC source material 39 and prevent its carbonization. However, thick and/or long boules of SiC single crystal 36' where unable to be grown due to the erosion of foam member 35, source carbonization, formation of graphite inclusions and other defects in the growing SiC single crystal 36'. For the purpose of simplicity, the growth chamber has been omitted from FIG. 3.

With reference to FIG. 4, another modification of the basic PVT growth technique includes a susceptor 46, a crucible 43 containing semiconductor purity silicon 42, a SiC seed 40 attached to a seed-holder 41, and a high-purity, gas-permeable membrane 47 disposed between seed 40 and silicon 42. Membrane 47 can be in the form of porous graphite disc or in the form of dense graphite disc with multiple holes.

Upon heating, silicon 42 melts and vaporizes. The Si vapor emanating from the molten silicon 42 diffuses through porous membrane 47, where it reacts with carbon of membrane 42 producing volatile $Si_2C$ and $SiC_2$ molecular associates. Vapor 44 including the volatile $Si_2C$ and $SiC_2$ molecular associates escape from membrane 47, migrate to seed 40, and condense on it causing growth of single crystal 45. Thus, membrane 47 serves as a source of carbon. For the purpose of simplicity, an RF coil and a growth chamber have been omitted from FIG. 4.

One of the shortcomings of prior art SiC sublimation growth techniques is the phenomenon of vapor erosion of graphite. With reference to FIG. 5, in conventional PVT growth a crystal growth crucible 50 includes solid a SiC source 51 at the bottom, a SiC seed 52 attached to the crucible top, and a SiC single crystal 54 growing on seed 52. Usually, the edge of the boule of SiC single crystal 54 is in close proximity to (sometimes touching) a graphite sleeve 55 disposed in the vicinity of the growing SiC single crystal 54. This sleeve 55 can be a heat shield, growth guide, or the crucible wall, all generally made of graphite. The distance between the SiC single crystal 54 and SiC source 51 is usually much more significant.

During growth of SiC single crystal 54, SiC source 51 sublimes and generates Si-rich vapor 53, with an Si:C atomic ratio generally between 1.1 and 1.6, and carbon residue 51a. Vapor 53 in the space 57 adjacent to the SiC source 51 is in equilibrium with the SiC+C mixture. Driven by the temperature gradient, vapor 53 moves axially toward SiC seed 52. This movement of vapor 53 is in the form of Stefan gas flow with the linear rate of about 1-10 cm/s.

Upon reaching the growth interface, vapor 53 condenses causing growth of the SiC single crystal 54. Precipitation of stoichiometric SiC from the Si-rich vapor 53 makes the vapor even more Si-rich in the space 58 adjacent SiC crystal 54. Therefore, the vapor phase composition in this space does not correspond anymore to the SiC+C equilibrium. Instead, vapor 53 is now in equilibrium with either SiC of a certain stoichiometry or, in the extreme case, with the two-phase SiC+Si mixture. A too high content of Si in vapor 53 can lead to the formation of the liquid Si phase on the growth interface and incorporation of Si droplets into the growing crystal.

The atomic fraction of Si in vapor 53 in space 58 is the highest inside crucible 50, and this forces excessive Si to diffuse out of space 58. Due to the significant distance between SiC single crystal 54 and SiC source 51 and the presence of the axial Stefan flow in crucible 50, the excessive Si does not reach SiC source 51. Rather, it diffuses from SiC single crystal 54 toward and reaches the nearest graphite part—sleeve 55. This diffusion is shown by arrows 56. This Si-rich vapor (which is not in equilibrium with carbon) attacks graphite sleeve 55 and erodes it producing $SiC_2$ and $Si_2C$ gaseous molecules.

In a typical PVT geometry, the temperature of sleeve 55 is higher than that of the SiC single crystal 54. Driven by this radial temperature gradient, the gaseous products of graphite erosion ($SiC_2$ and $Si_2C$) diffuse back toward SiC single crystal 54, as shown by arrows 56a, and enrich space 58a in the peripheral area 54b of SiC single crystal 54 in front of the growth interface with carbon. In other words, a zone of vapor circulation emerges at the edges of SiC single crystal 54 with silicon acting as a transport agent and transporting carbon from sleeve 55 to the lateral regions of growing SiC single crystal 54. In SiC single crystals 54 grown by the PVT technique, carbon from sleeve 55 can comprise up to 20% of the total carbon content of the crystal.

The net result of this vapor circulation is the formation of two distinct regions in the vapor in the vicinity of the growing crystal. The vapor in central region 58 has a higher atomic fraction of silicon than the vapor in the lateral region 58a. Accordingly, central area 54a of SiC single crystal 54 grows from Si-rich vapor, while the peripheral area 54b of SiC single crystal 54 grows from the vapor containing a higher fraction of carbon.

Such compositional nonuniformity of the vapor phase has negative consequences for the crystal quality, including:
Spatial nonuniformity of the crystal composition (stoichiometry) resulting in a high degree of crystal stress, cracking and spatially nonuniform incorporation of impurities and dopants;
Formation of foreign polytypes and related defects;
Inclusion of carbon particles transported from the source;
Inclusion of carbon particles transported from the eroded sleeve; and
Inclusion of Si droplets in central areas of the crystal.

For the purpose of simplicity, an RF coil and a growth chamber have been omitted from FIG. 5.

SUMMARY OF THE INVENTION

The invention is a physical vapor transport growth system. The system includes a growth chamber charged with SiC source material and a SiC seed crystal in spaced relation and an envelope that is at least partially gas-permeable disposed in the growth chamber. The envelope separates the growth chamber into a source compartment that includes the SiC source material and a crystallization compartment that includes the SiC seed crystal. The envelope is formed of a material that is reactive to vapor generated during sublimation growth of a SiC single crystal on the SiC seed crystal in the crystallization compartment to produce a C-bearing vapor that acts as an additional source of C during the growth of the SiC single crystal on the SiC seed crystal.

The envelope can be comprised of a sleeve that surrounds sides of the SiC seed crystal and the growing SiC single crystal and a gas-permeable membrane disposed between the SiC source material and a surface of the SiC seed crystal that faces the SiC source material.

The sleeve can be disposed between 0.5 mm and 5 mm from the sides of the SiC seed crystal and the growing SiC single crystal.

The gas-permeable membrane can be disposed between 15 mm and 35 mm from the surface of the SiC seed crystal that faces the SiC source material.

The gas-permeable membrane can be made of porous graphite having a density between 0.6 and 1.4 $g/cm^3$ and a porosity between 30% and 70%.

The graphite forming the gas-permeable membrane can be comprised of graphite grains, each of which has a maximum dimension between 100 and 500 microns.

The gas-permeable membrane can have a thickness between 3 mm and 12 mm.

The sleeve can have a wall thickness between 4 mm and 15 mm.

The sleeve can be cylindrical and the membrane can be disposed at one end of the sleeve.

The invention is also a physical vapor transport growth method that comprises: (a) providing a growth chamber that is separated by an envelope that is at least partially gas-permeable into a source compartment that is charged with a SiC source material and a crystallization compartment that includes a SiC seed crystal; and (b) heating the interior of the growth crucible such that a temperature gradient forms between the SiC source material and the SiC seed crystal, the SiC source material is heated to a sublimation temperature, and the temperature gradient is sufficient to cause sublimated SiC source material to diffuse from the source compartment through the gas-permeable part of the envelope into the crystallization compartment where the sublimated SiC source material condenses on the SiC seed crystal and forms a SiC single crystal, wherein said envelope is comprised of a material that is reactive to vapor generated during sublimation growth of the SiC single crystal on the SiC seed crystal in the crystallization compartment to produce a C-bearing vapor that acts as an additional source of C during the growth of the SiC single crystal on the SiC seed crystal.

Step (b) can occur in the presence of between 1 and 100 Torr of inert gas.

A capsule can be disposed in the source compartment. The capsule can have an interior that is charged with a dopant. The capsule can have one or more capillaries of predetermined diameter and length that extend between the interior and an exterior of said capsule. The diameter and the length of each capillary can be selected whereupon the dopant is disposed spatially uniformly in the grown SiC single crystal.

The capsule can be made of graphite. The dopant can be either elemental vanadium or a vanadium compound in quantity sufficient for full electronic compensation of the grown SiC single crystal.

The method can further include: charging the growth chamber with elemental Si and C; and prior to heating the SiC source material to the sublimation temperature, heating the elemental Si and C to a temperature below the sublimation temperature for synthesis of the elemental Si and C into a solid SiC that comprises the SiC source material.

The mean, room temperature electrical resistivity of the grown SiC single crystal is above $10^9$ Ohm-cm with a standard deviation below 10% of the mean value. The grown SiC single crystal is of the 4H or 6H polytype.

BRIEF DESCRIPTION OF THE DRAWINGS

FIG. 9c is a resistivity map for one of the wafers fabricated from the boule shown in FIG. 9a.

DESCRIPTION OF THE INVENTION

The invention describes an improved SiC sublimation crystal growth process and apparatus for the growth of high quality SiC single crystals suitable for the fabrication of industrial size substrates, including those of 3" and 100 mm diameter. The crystal growth crucible of the invention is divided into two compartments by a gas-permeable porous graphite membrane, which is positioned in close proximity to the seed. During growth, the membrane interacts with the Si-rich vapor and supplies additional carbon to the growing crystal. The membrane enriches the vapor phase with carbon and makes the vapor composition in front of the growing crystal more uniform. It also prevents particles originated from the source from contaminating the growth interface. It also makes the isotherms more flat.

The invention leads to SiC boules with reduced densities of inclusions, such as foreign polytypes, silicon droplets and carbon particles, and it reduces stress and cracking. The growth cell design of the invention permits incorporation of in-situ synthesis of SiC into the SiC sublimation growth process.

The process and apparatus can be used for the growth of SiC single crystals of 6H and 4H polytypes, both undoped and doped, including those doped with vanadium.

Figure 1:
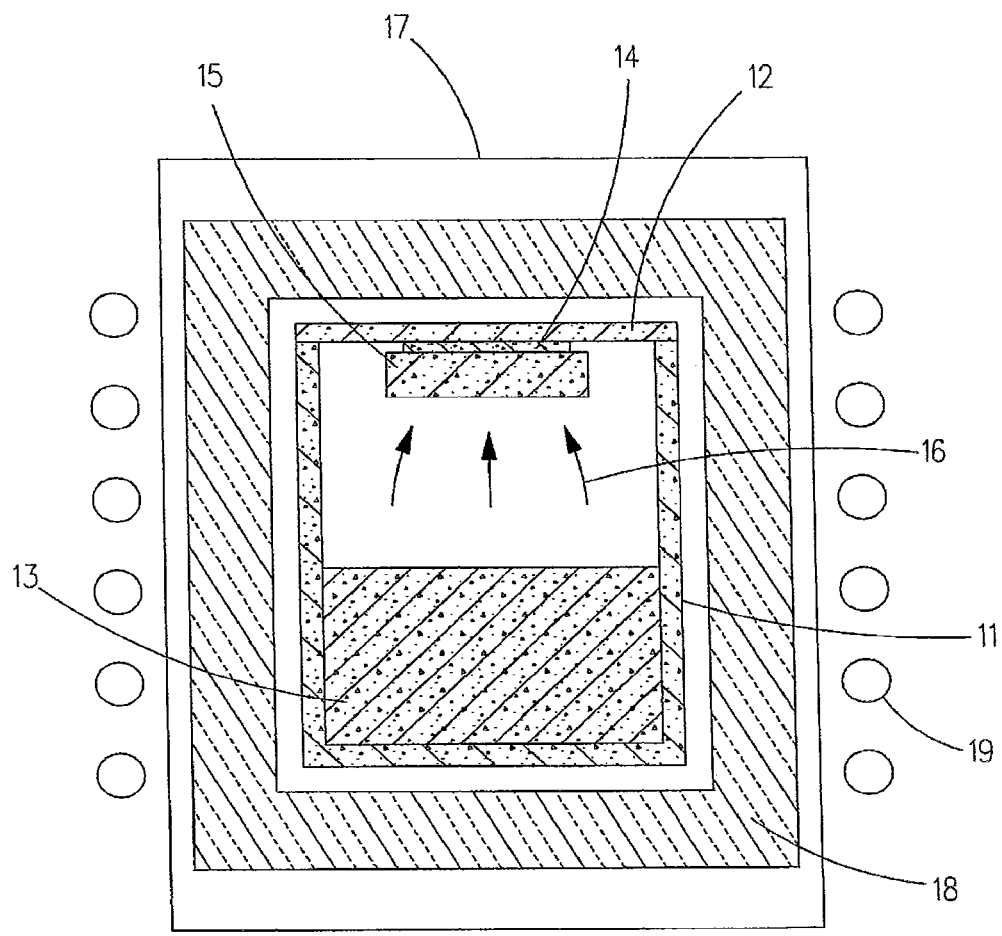
FIGS. 1-5 are cross-sectional schematic views of different embodiment prior art physical vapor transport (PVT) growth cells.
Figure 2:
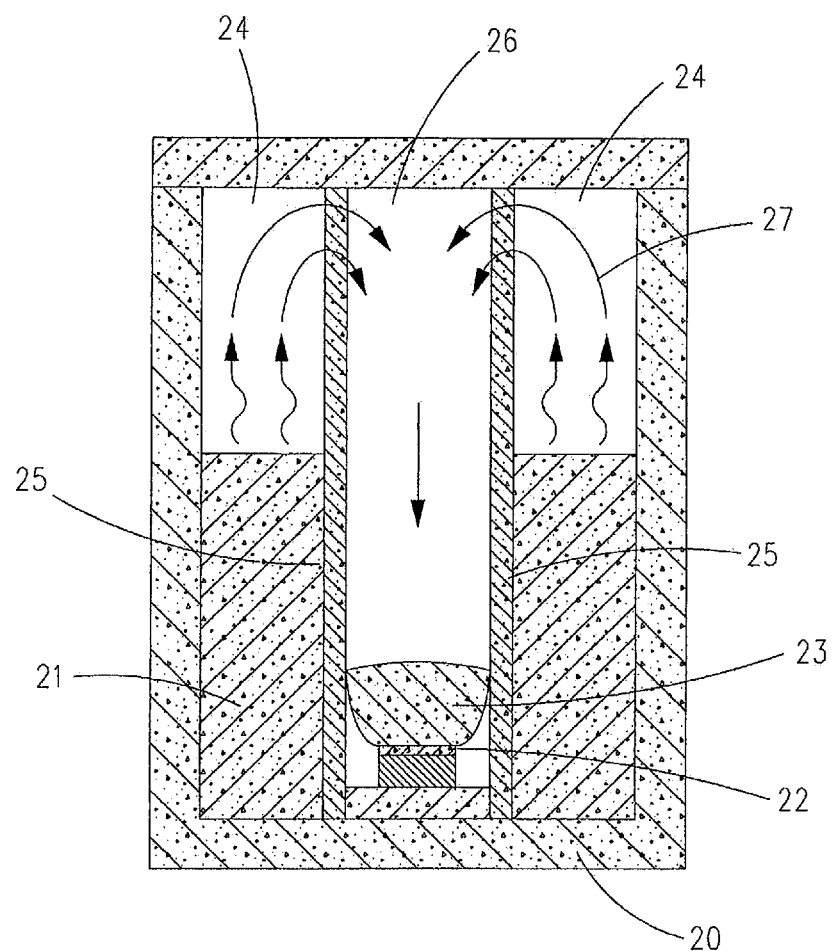
Figure 3:
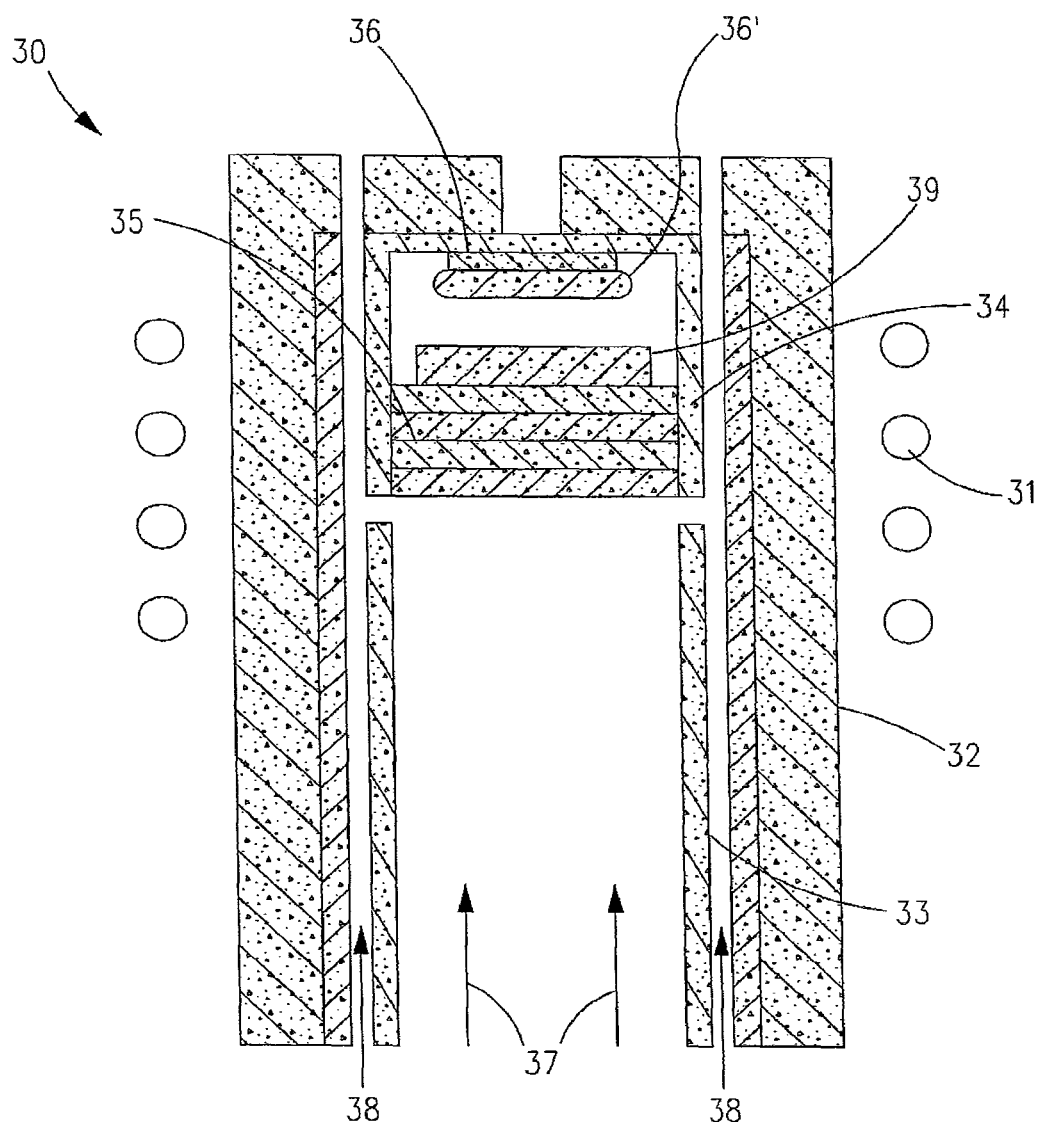
Figure 4:
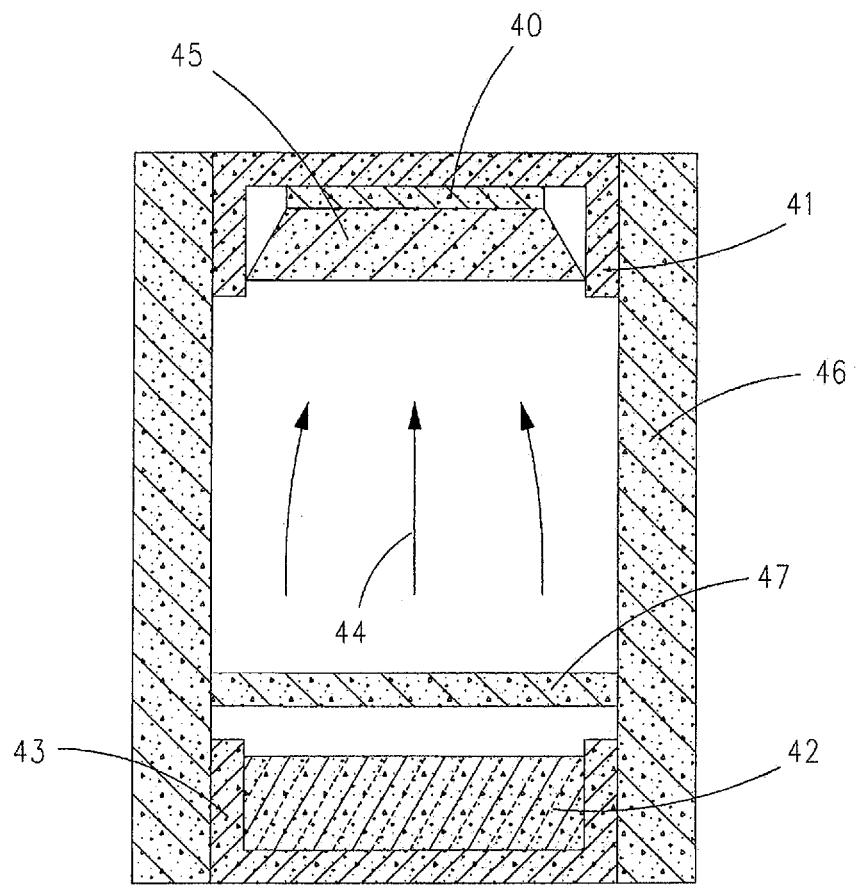
Figure 5:
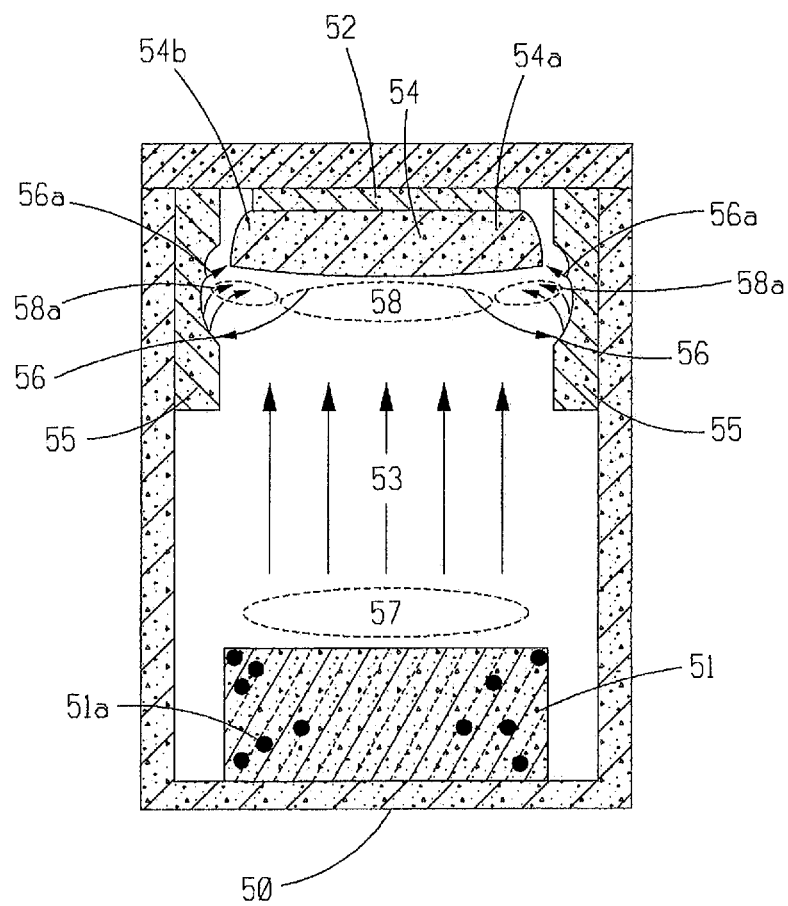
Figure 6:
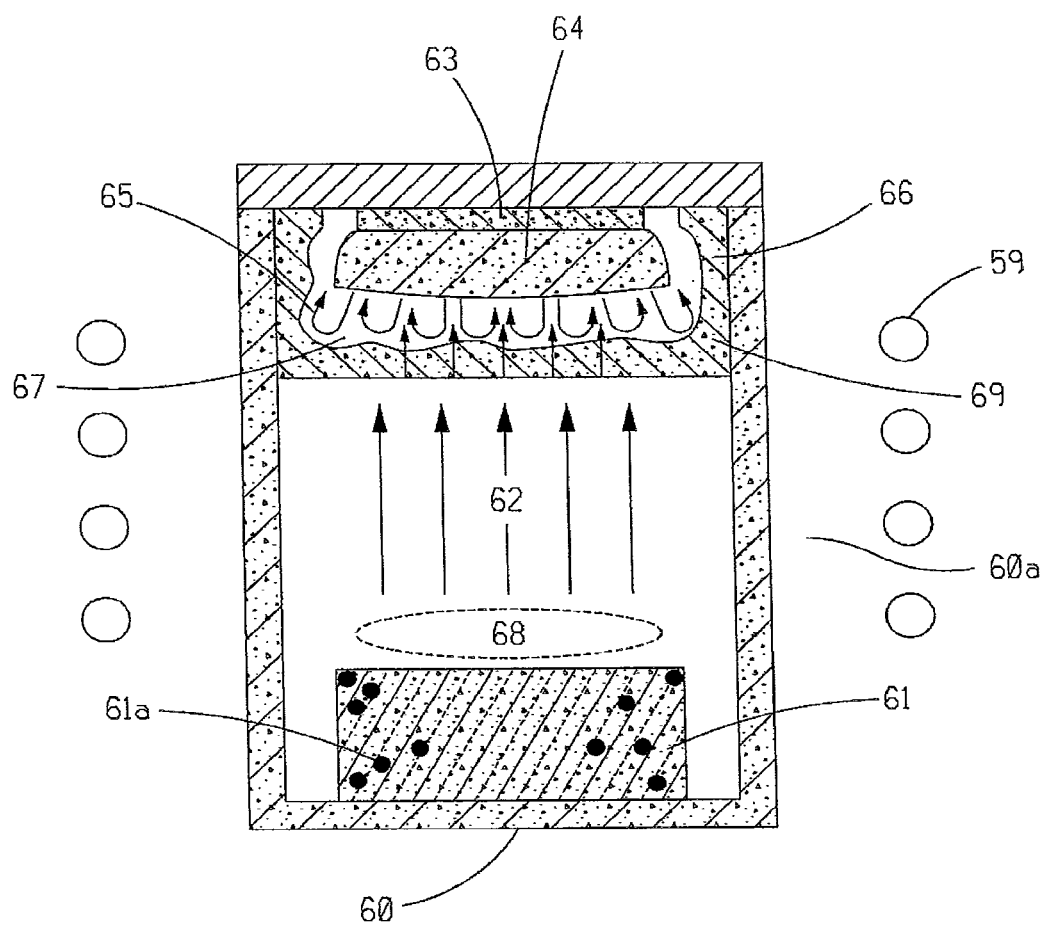
FIGS. 6-8 are cross-sectional schematic views of different embodiment PVT growth cells in accordance with the present invention.

With reference to FIG. 6, PVT growth in accordance with the present invention is carried out in a graphite crucible 60 that includes SiC source 61 at the bottom of crucible 60 and a SiC single crystal seed 63 at the top of crucible 60. During growth of a SiC single crystal 64 on SiC single crystal seed 63, crucible 60 is disposed inside of a growth chamber 60a where crucible 60 is heated, either resistively or by an inductive heating means 59, to a suitable temperature for the growth of a SiC single crystal 64 on SiC single crystal seed 63.

An envelope 66, that is at least in-part porous and gas-permeable, at least partially surrounds SiC seed crystal 63 and SiC single crystal 64. SiC seed crystal 63 can be attached directly to a lid of crucible 60 or, as shown in FIG. 6, to a suitable standoff disposed between the lid of crucible 60 and SiC seed crystal 63. Envelope 66 forms a quasi-closed vapor circulation space 67 around the surfaces, sides, edges, and faces of SiC single crystal seed 63 and growing SiC single crystal 64 that face SiC source 61. Envelope 66 is made of porous, gas-permeable graphite and is positioned a short distance from growing SiC single crystal 64.

Upon reaching the desired growth temperature, SiC source 61 sublimes and fills the interior of crucible 60 with Si-rich vapor 62. During evaporation, carbon residue 61a is formed in SiC source 61. Vapor 62 in the space 68 adjacent to SiC source 61 is in equilibrium with the SiC+C mixture.

Driven by a temperature gradient in the interior of crucible 60, vapor 62 migrates axially toward SiC single crystal seed 63 and enters space 67 by diffusing through the front wall (membrane) 69 of envelope 66. In the process of diffusion, small-size particles emanating from SiC source 61 are filtered from the vapor 62 by envelope 66. Thus, porous envelope 66 helps to avoid contamination of the growth interface with particulates.

After passing through membrane 69, vapor 62 reaches the growth interface and condenses on it causing growth of SiC single crystal 64. As a result of precipitation of stoichiometric SiC from the Si-rich vapor 62, vapor 62 becomes even more enriched with Si and forms vapor 65. This Si-rich vapor 65 diffuses in space 67 in the direction from the growth interface toward the inner surface of envelope 66. The distance between growing SiC single crystal 64 and the interior wall of membrane 69 is selected so that diffusing Si-bearing molecules in vapor 65 reach the interior wall of envelope 66 in spite of the Stefan gas flow in the opposite direction.

Upon contact with the interior wall of envelope 66, the excess Si in vapor 65 (which is not in equilibrium with carbon) attacks and erodes it generating volatile molecular associates $Si_2C$ and $SiC_2$, whereupon the initially Si-rich vapor 65 will now include these C-bearing species.

The temperature of envelope 66 is controlled to be higher than that of SiC single crystal 63. This forces vapor 65 now including these C-bearing species to diffuse toward SiC single crystal 63 and participate in SiC crystallization, thereby forming SiC single crystal 64. As can be seen, Si acts as a transport agent for carbon and envelope 66 serves as a sacrificial carbon body supplying additional carbon to the growing SiC single crystal 64.

Porous, gas-permeable envelope 66 has a wall thickness and is positioned a relatively small distance from SiC seed crystal 63. The thickness of the front wall 69 of envelope 66 is chosen by taking into account the following factors:

A polycrystalline SiC deposit can form on the front wall 69 of envelope 66. Therefore, envelope 66 is desirably mechanically strong enough to support the weight of this deposit.

Envelope 66 should be sufficiently thick to make the vapor migration across the membrane the limiting stage of mass transport in the crucible. If the envelope 66 is too thin, solid SiC will form on the top surface of front wall 69 of envelope 66 and lead to deterioration in the quality of growing SiC single crystal 64.

A too thick envelope 66 will impede vapor transport in the crucible and reduce the growth rate of SiC single crystal 64.

The distance between the seed and the membrane is chosen on the basis of the following:

If envelope 66 is positioned too far from SiC single crystal 63, the Si-rich vapor generated as a result of crystallization will not reach envelope 66.

If envelope 66 is positioned too close to SiC single crystal 63, the crystal thickness will be limited.

Exemplary dimensions of porous, gas-permeable envelope 66 are described in the embodiments described hereinafter. The geometry of the PVT growth cell shown in FIG. 6 has several advantages in the growth of SiC single crystal 64:

The presence of the sacrificial carbon envelope in close proximity to the growing SiC single crystal 64 increases the carbon content in the vapor phase in the space adjacent to the growth interface. A more carbon-rich vapor phase leads to better stability of the hexagonal polytypes (6H and 4H) and suppression of non-hexagonal polytypes, such as 15R.

Envelope 66 reduces or eliminates spatial nonuniformity of the vapor phase composition in front of the growth interface, thus reducing or eliminating the compositional nonuniformity of the growing SiC single crystal 64. This leads to a reduced stress and cracking in SiC single crystal 64.

The more spatially uniform vapor phase makes incorporation of impurities and dopants into the growing SiC single crystal 64 more spatially uniform.

The higher carbon content in vapor 65 surrounding the growing SiC single crystal 64 avoids or eliminates the formation of liquid silicon on the growth interface and inclusion of Si droplets.

Envelope 66 prevents particles generated in SiC source 61 from reaching and incorporating into the growing SiC single crystal 64.

The graphite forming envelope 66 positively affects the geometry of the thermal field in the vicinity of the growing SiC single crystal 64. Specifically, the flat front wall 69 of envelope (membrane) 66 makes the isotherms adjacent the growth interface more flat. Flatter isotherms, in-turn, make the growth interface more flat, which is beneficial to the polytype stability and stress reduction.

Embodiment 1: Growth of Semi-Insulating SiC Crystals

Figure 7:
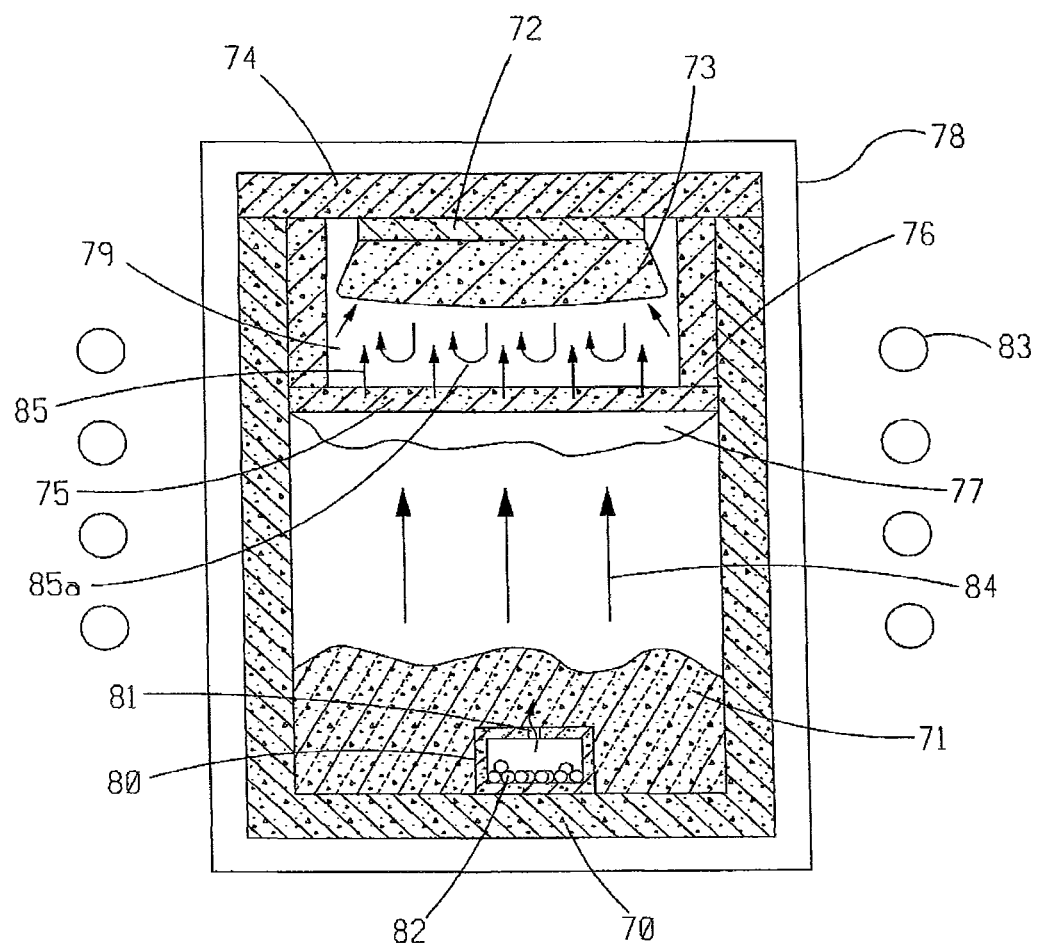

A schematic diagram of a PVT growth cell for the growth of semi-insulating SiC crystals fully compensated by dopant, such as vanadium, is shown in FIG. 7. SiC crystal growth is carried out in a cylindrical crucible 70 made of graphite, desirably, dense, low-porosity isostatically molded graphite, such as ATJ or similar. Crucible 70 contains a solid SiC source 71 disposed at the bottom of crucible 70 and a SiC seed crystal 72 at the crucible top of crucible 70, for instance, attached to the crucible lid 74, as shown in the FIG. 7. SiC source 71 is desirably in the form of pure polycrystalline SiC grain synthesized separately.

In accordance with the doping procedure disclosed in U.S. Patent Publication No. 2006/0243984, which is incorporated herein by reference, crucible 70 includes a time-release capsule 80 charged with a dopant 82. Capsule 80 includes a stable form of dopant 82, desirably, elemental vanadium, vanadium carbide or vanadium oxide. Capsule 80 is desirably made of an inert material, desirably, dense, low-porosity graphite, such as ATJ, and it includes one or more capillaries 81 of predetermined diameter and length. A more detailed description of the doping capsule is given in U.S. Patent Publication No. 2006/0243984. Capsule 80 loaded or charged with vanadium is buried in the bulk of SiC source 71, as shown in FIG. 7.

SiC seed crystal 72 is a wafer of 4H or 6H SiC polytype sliced from a previously grown SiC crystal. The growth face of SiC seed crystal 72 is polished to remove scratches and sub-surface damage. The preferred orientation of SiC seed crystal 72 is "on-axis", that is, parallel to the crystallographic c-plane. However, other orientations of SiC seed crystal 72 can also be used, such as, without limitation, off-cut from the c-plane by several degrees. In the case of 6H, the Si-face of SiC seed crystal 72 is the growth face. In the case of 4H, the C-face of SiC seed crystal 72 is the growth face.

SiC seed crystal 72 (and later the growing SiC single crystal 73) is surrounded by a porous, gas-permeable envelope comprised of a horizontal membrane 75 and a cylindrical sleeve 76. SiC seed crystal 72, crucible lid 74, membrane 75 and sleeve 76 define the boundaries of a vapor circulation space 79.

Membrane 75 and sleeve 76 are made of porous graphite with a density, desirably, between 0.6 and 1.4 g/cm$^3$ and a porosity, desirably, between 30% and 70%. In order to avoid contamination of growing SiC single crystal 73 with micron-size graphitic particles generated as a result of graphite erosion of membrane 75 and sleeve 76, the material forming membrane 75 and sleeve 76 is porous graphite with large grain sizes, desirably, from 100 to 500 microns. When grains of this size are liberated by graphite erosion, they are too heavy to be transported by the Stefan gas flow.

Membrane 75 has a thickness, desirably, between 3 and 12 mm and is disposed at a distance from the SiC seed crystal 72, desirably, between 15 and 35 mm. In the example shown in FIG. 7, sleeve 76 is cylindrical, but it can also have other useful shapes deemed desirable by those skilled in the art, such as, without limitation, a truncated cone or a hexagonal pyramid. The wall thickness of sleeve 76 is, desirably, between 4 and 15 mm and the distance between the interior surface of sleeve 76 and the edge of SiC seed crystal 72 is, desirably, between 0.5 and 5 mm.

Loaded crucible 70 is placed inside a gas-tight chamber 78, which is evacuated and filled with an inert gas, such as argon or helium, to a pressure between 1 to 100 Torr. Crucible 70 is then heated to a temperature between 2000 and 2400° C. using inductive or resistive heating means 83. During growth, the temperature of SiC source 71 is controlled to be higher than the temperature of membrane 75, typically, by 10° C. to 150° C. At the same time, the temperature of membrane 75 is controlled to be 20° C. to 50° C. higher that the temperature of SiC seed crystal 72.

Upon reaching SiC sublimation temperatures, SiC source 71 vaporizes and fills the interior of crucible 70 with Si-rich vapor 84 comprised of Si, Si$_2$C and SiC$_2$ volatile molecules. During initial stages of the growth of SiC single crystal 73 on SiC seed crystal 72, vapor 84 migrates to and precipitates on porous membrane 75 forming a polycrystalline SiC deposit 77. Then, the SiC deposit 77 sublimes and vapor 85 emanating from SiC deposit 77 diffuses across membrane 75 and reaches SiC seed crystal 72. The thickness of membrane 75 is selected such that the migration of vapor 85 across membrane 75 is the limiting stage in the overall mass transport.

After passing through membrane 75, vapor 85 reaches the growth interface and condenses causing the growth of SiC single crystal 73 on SiC seed crystal 72. As a result of SiC crystallization, silicon enrichment of vapor 85 adjacent the growth interface takes place and forms vapor 85$a$. Vapor 85$a$ including excessive silicon diffuses in space 79 toward the membrane 75 and sleeve 76 and attacks them forming Si$_2$C and SiC$_2$ volatile molecules. Driven by temperature gradients, vapor 85$a$ including these Si$_2$C and SiC$_2$ molecules is transported to the growth interface.

During growth, capsule 80 releases vanadium-containing vapor into the interior of crucible 70 through the one or more capillaries 81. The dimensions of each of the one or more capillaries 81 are selected to cause the vanadium concentration in the grown SiC single crystal 73 to be sufficient for complete compensation without generation of crystal defects. The presence of porous graphite membrane 75 does not prevent the transport of vanadium to the growth interface. At the same time, membrane 75 improves the spatial uniformity of vanadium doping, thus making the resistivity of the grown SiC single crystal 73 spatially uniform.

Growth of semi-insulating SiC single crystal 73 requires strict adherence to the purity of SiC source 71 and materials of growth crucible 70. Halogen purification of growth crucible 70 and other graphite parts used in the growth of SiC single crystal 73 is commonplace. However, porous membrane 75 and sleeve 76 are sacrificial carbon bodies supplying carbon to the growing crystal. Therefore, their purity, especially with respect to boron, is critical. Accordingly, the boron content in membrane 75 and sleeve 76 is, desirably, controlled to be below 50 ppb by weight and the contents of other metals in membrane 75 and sleeve 76 are desirably below their GDMS detection limits.

Another desired treatment of membrane 75 and sleeve 76 prior to PVT growth is the removal of small graphite particles from their surfaces and bulk. Such particles are generated during machining and handling of these parts. The preferred treatment includes ultrasonic cleaning in deionized water for 15 minutes followed by drying in a circulation oven.

Figure 8:
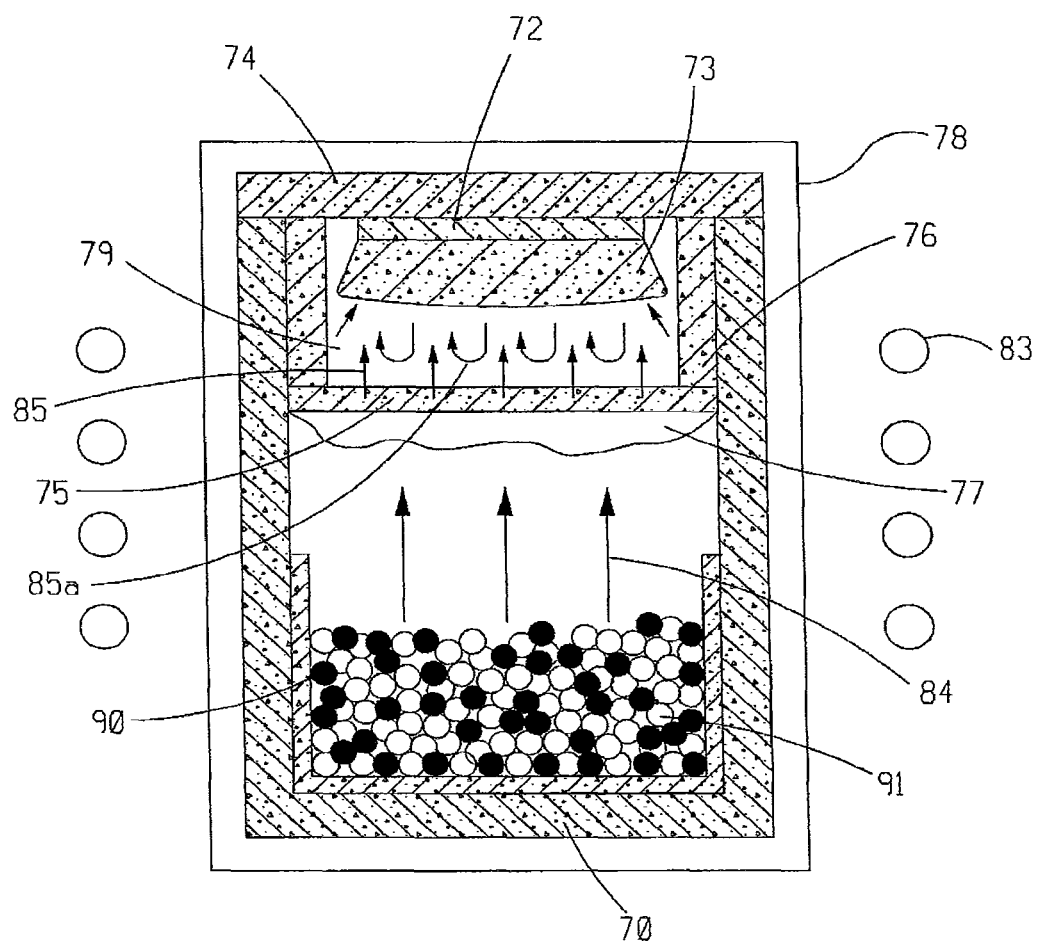

Embodiment 2: PVT Growth of SiC Crystal Combined with In-Situ Synthesis of SiC Source FIG. 8 is an illustration of a growth cell similar to the growth cell shown and described in connection with FIG. 7, except that the growth cell of FIG. 8 includes an interior graphite crucible 90 loaded with a mixture of Si and C raw materials 91 for in-situ synthesis of SiC from elemental Si and C. The elemental Si and C raw materials 91 desirably have atomic ratio of 1:1 and can be in the form of finely divided powders or, desirably, in the form of small lumps or pellets of 0.5 to 3 mm in size.

The initial heating of crucible 70 is carried out in vacuum, that is, under continuous evacuation of the growth chamber. A diffusion or turbomolecular pump of a suitable capacity can be used for such pumping. During heating, the pressure in chamber 78 and, hence, crucible 70 is, desirably, not higher than $5.10^6$ Torr.

Heating of crucible 70 continues until the temperature of crucible 70 reaches about 1600° C., which is above the melting point of pure Si (1460° C.). Crucible 70 is soaked at this temperature for 1 hour to complete the reaction between elemental Si and C.

The enthalpy of direct reaction between Si and C is high, about 100 kJ/mol. Therefore, synthesis of SiC from elemental Si and C can lead to a rise in the temperature of the SiC charge. Here, in this embodiment, membrane 75 plays another role: it acts as a heat shield that avoids SiC seed crystal 72 from overheating and carbonization, which otherwise could be caused by the release of the heat of reaction between Si and C. Membrane 75 also prevents contamination of the surface of SiC Seed 72 by particles generated during the reaction between Si and C.

After the reaction between elemental Si and C is completed and solid SiC is formed in crucible 90, chamber 78 and, hence, crucible 70 is filled with inert gas, such as argon or helium, to a pressure of about 500 Torr and the temperature of crucible 70 is raised to a desired growth temperature between 2000° and 2400° C. Following this, PVT growth of SiC single crystal 73 on SiC seed crystal 72 is carried out as described in the previous embodiment.

For the growth of vanadium-compensated semi-insulating SiC crystals, a doping capsule, similar to doping capsule 80 in the embodiment of FIG. 7, is used. Such doping capsule is buried in the bulk of the elemental Si and C mixture 91. It has been observed that the reaction between elemental Si and C does not affect the vanadium source inside the capsule.

It has been observed that the use of the above-described gas-permeable porous envelope comprised of porous membrane 75 and porous sleeve 76 in the sublimation growth of 6H and 4H SiC single crystals yields SiC boules with reduced densities of inclusions, such as foreign polytypes, silicon droplets and carbon particles. It has also been observed to reduce the degree of growth-related stress, which is the cause for subsequent boule/wafer cracking.

The above-described gas-permeable porous envelope comprised of porous membrane 75 and porous sleeve 76 also permits incorporation of in-situ synthesis of the SiC source into the sublimation growth process. This leads to a reduction of the process cycle time.

Two examples of 6H SiC growth runs will now be described.

Example 1. Growth of Semi-Insulating 6H SiC Crystal

This growth run was carried out in accordance with the embodiment 1 growth of semi-insulating SiC crystals described above. Specifically, a crystal growth crucible 70 made of dense, isostatically molded graphite (grade ATJ) was prepared. Pure SiC grain 0.5 to 2 mm in size was synthesized prior to growth using a separate synthesis process. A charge of about 600 g of the pure SiC grain was disposed at the bottom of crucible 70 and served as SiC source 71 for the growth run.

A doping capsule 80 made of dense ATJ graphite was prepared having a single capillary of 1 mm in diameter and 2 mm long. This capsule 80 was loaded with 1 gram of metallic vanadium of 99.995% purity. The loaded capsule 80 was buried in the source 71 on the bottom of crucible 70, as shown in FIG. 7.

A 3.25" diameter SiC wafer of the 6H polytype was prepared and used as SiC seed crystal 72. The wafer was oriented on-axis, that is, with its faces parallel to the basal c-plane. The growth surface of the wafer (Si face) was polished using a chemical-mechanical polishing technique (CMP) to remove scratches and sub-surface damage. SiC seed crystal 72 was attached to crucible lid 74 using a high-temperature carbon adhesive.

Gas-permeable membrane 75, in the form of a disc, and cylindrical sleeve 76 were prepared. Membrane 75 and sleeve 76 were machined of porous graphite with the density of 1 g/cm$^3$, porosity of 47% and average grain size of 200 microns. The thickness of membrane 75 was 4 mm, while the wall thickness of sleeve 76 was 10 mm. Prior to use in growth, membrane 75 and sleeve 76 were purified in halogen-containing atmosphere to remove boron and other impurities and to reduce the level of residual boron to below 50 ppb by weight.

Porous membrane 75 and sleeve 76 were positioned in crucible 70, as shown in FIG. 7. Membrane 75 was located a distance of 25 mm below the downward facing face of SiC seed crystal 72. The distance between sleeve 76 and the periphery (or edge or sides) of SiC seed crystal 72 was 3 mm.

Crucible 70 was loaded into a water-cooled chamber 78, made of fused silica, of an RF furnace where crucible 70 served as an RF susceptor. Thermal insulation made of fibrous light-weight graphite foam was placed in the space between crucible 70 and chamber 78. The interior of chamber 78 and, hence, the interior of crucible 70 were evacuated to a pressure of $1\cdot10^{-6}$ Torr and flushed several times with 99.9995% pure helium to remove any absorbed gases and moisture. Then, the interior of chamber 78 and, hence, the interior of crucible 70 was backfilled with He to 500 Torr and the temperature of crucible 70 was raised to about 2100° C. over a period of eight hours. Following this, the position of RF coil 83 and the furnace power were adjusted to achieve a temperature of SiC source material 71 of 2120° C. and a temperature of SiC crystal seed 72 of 2090° C. The He pressure was then reduced to 10 Torr to start sublimation growth. Upon completion of the run, the interior of chamber 78 and the interior of crucible 70 were cooled to room temperature over a period of 12 hours.

Figure 9A:
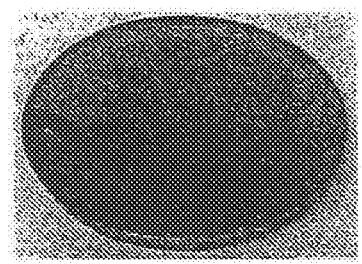
FIG. 9a is a photograph of an as-grown, vanadium-compensated 6H SiC single crystal boule that was grown in a PVT growth cell like the one shown in FIG. 7.

FIG. 9a shows a photograph of the as-grown, vanadium-compensated 6H SiC single crystal boule. The boule weighed 250 grams and included 30 grams of carbon transported from the porous membrane and sleeve. Neither carbon particles, nor Si droplets, nor inclusions of the 15R polytype were found in this high quality crystal boule. The micropipe density in this crystal boule was below 25 cm$^{-2}$.

Figure 9B:
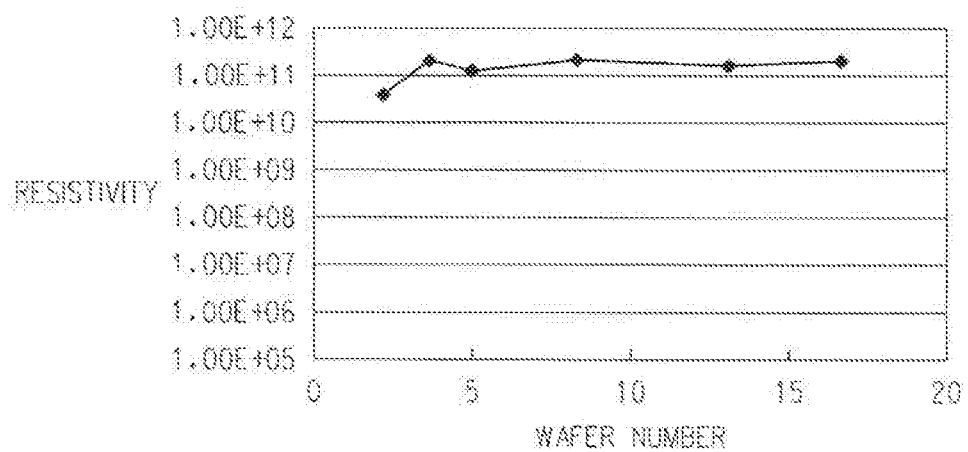
FIG. 9b is the axial resistivity distribution in the crystal boule shown in FIG. 9a determined from standard wafers fabricated from the boule.
Figure 9C:
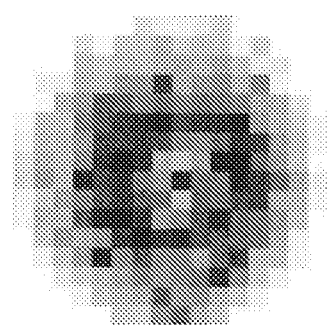

The boule was fabricated into standard 3" diameter wafers, and their resistivity was measured and mapped using a contactless resistivity tool. The axial resistivity distribution in this crystal boule and a resistivity map for one of the sliced wafers are shown in FIGS. 9b and 9c, respectively. The resistivity of the grown crystal boule was above $5\cdot10^{10}$ Ohm-cm, with a majority of the sliced wafers having a resistivity above $1\cdot10^{11}$ Ohm-cm, and a standard deviation below 10%.

Example 2. Growth of Semi-Insulating 6H SiC Crystal

With reference to FIG. 8, growth of a vanadium-compensated 6H SiC single crystal was carried out in accordance the embodiment 2 growth of semi-insulating SiC crystals described above. The growth crucible used for this growth was similar to that used in Example 1 above. A thin-walled interior graphite crucible (90 in FIG. 8) was machined from dense ATJ graphite. The interior of crucible 90 was loaded with 600 g of a raw material mixture of elemental Si and C in a 1:1 atomic ratio. The Si and C forming this mixture was in the form of small lumps or pellets, 0.5 mm to 1 mm in dimension.

A doping capsule 80 containing 1 gram of vanadium was placed at the bottom of crucible 90, under the Si+C mixture. The geometry of this capsule 80 was similar to that described in the previous example.

Gas-permeable membrane 75 and sleeve 76 having the same dimensions as in Example 1 were machined from porous graphite of the same grade as in Example 1. Membrane 75 and sleeve 76 were halogen-purified to reduce the level of boron to below 50 ppb by weight. Porous membrane 75 and sleeve 76 were positioned in crucible 70, as shown in FIG. 8.

The crucible 70 including the doping capsule 80, the raw material Si+C mixture 91, SiC crystal seed 72, porous membrane 75, and sleeve 76 surrounding SiC crystal seed 72 was placed into crystal growth chamber 78. Chamber 78 was then evacuated, flushed with pure helium, as described in the previous example, and then again evacuated to a pressure of $1\cdot10^{-6}$ Torr.

Crucible 70 was then heated to 1600° C. under continuous evacuation of chamber 78 and crucible 70 using a turbomolecular pump. During heating, the pressure in chamber 78 and crucible 70 remained below $5\cdot10^{-6}$ Torr. Upon approaching the temperature of 1600° C., an increase in pressure and temperature was noticed. This served as an indication that the reaction between the elemental Si and C raw material mixture 91 leading to the formation of solid SiC had started. Crucible 70 was soaked at 1600° C. for 1 hour to complete the reaction of the elemental Si and C raw material mixture 91 to a solid SiC.

After completing the synthesis of the solid SiC, the chamber 78 and, hence, crucible 70 were filled with pure helium to 500 Torr and the temperature of crucible 70 was raised to about 2100° C. Following this, PVT growth of SiC single crystal 73 was carried as in the previous example 1. During growth of SiC single crystal 73 in this example 2, the temperatures of SiC source 91 and SiC seed crystal 72 were controlled to reach 2170° C. and 2110° C., respectively, and the He pressure inside chamber 78 and crucible 70 was reduced to 20 Torr.

Figure 10:
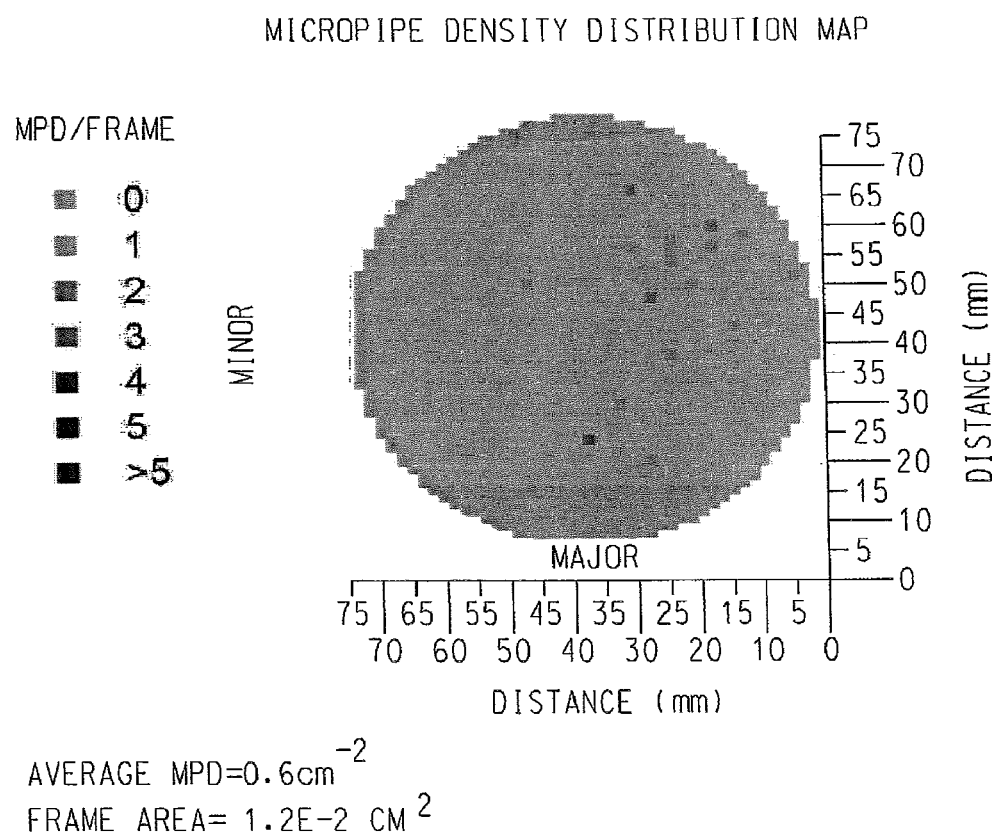
FIG. 10 is a micropipe density map obtained from a wafer fabricated from a vanadium-compensated 6H SiC single crystal boule that was grown in a PVT growth cell like the one shown in FIG. 8.

Investigation of the SiC single crystal 73 boule grown in accordance with this example 2 and the wafers sliced therefrom showed that the grown SiC single crystal 73 boule included no visible carbon particles, Si droplets, or inclusions of the 15R polytype. The average micropipe density in this SiC single crystal 73 boule was below 1 cm$^{-2}$, as shown in FIG. 10.

The SiC single crystal 73 boule grown in accordance with this example 2 was fabricated into wafers yielding 25 standard 3" substrates. These wafers were evaluated for their electrical resistivity. All 25 wafers were semi-insulating with a resistivity above $1\cdot10^{10}$ Ohm-cm and standard deviation below 10%.

The invention has been described with reference to preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A physical vapor transport growth system comprising:
   a growth chamber charged with SiC source material and a SiC seed crystal in spaced relation; and
   an envelope that is at least partially gas-permeable disposed in the growth chamber and separating the growth chamber into a source compartment that includes the SiC source material and a crystallization compartment that includes the SiC seed crystal, said gas-permeable envelope formed of a material that is reactive to vapor generated by sublimation growth of a SiC single crystal on the SiC seed crystal in the crystallization compartment, wherein said gas-permeable envelope is positioned in the growth chamber such that the vapor generated by sublimation growth reacts with the material forming the envelope to produce a carbon-bearing vapor that acts as an additional source of carbon during the growth of the SiC single crystal on the SiC seed crystal;
   wherein the envelope is comprised of: a sleeve that surrounds sides of the SiC seed crystal and the growing SiC single crystal; and a gas-permeable membrane disposed between the SiC source material and a surface of the SiC seed crystal that faces the SiC source material;
   wherein the gas-permeable membrane is made of porous graphite; and
   wherein the graphite forming the gas-permeable membrane is comprised of graphite grains, each of which has a maximum dimension between 100 and 500 microns.

2. The system of claim 1, wherein the sleeve is disposed between 0.5 mm and 5 mm from the sides of the SiC seed crystal and the growing SiC single crystal.

3. The system of claim 1, wherein the gas-permeable membrane has a thickness between 3 mm and 12 mm.

4. The system of claim 1, wherein the sleeve has a wall thickness between 4 mm and 15 mm.

5. The system of claim 1, wherein the sleeve is cylindrical and the membrane is disposed at one end of the sleeve.

6. The system of claim 5, wherein the sleeve is disposed between 0.5 mm and 5 mm from the sides of the SiC seed crystal and the growing SiC single crystal.

7. The system of claim 5, wherein the gas-permeable membrane has a thickness between 3 mm and 12 mm.

8. The system of claim 5, wherein the sleeve has a wall thickness between 4 mm and 15 mm.

* * * * *